United States Patent [19]

Kunz

[11] Patent Number: 4,999,458
[45] Date of Patent: Mar. 12, 1991

[54] ELECTRICAL CURRENT LEAD-IN DEVICE AT A VACUUM CHAMBER

[75] Inventor: Anton Kunz, Triesenberg, Liechtenstein

[73] Assignee: Balzers Aktiengesellschaft, Balzers, Liechtenstein

[21] Appl. No.: 463,372

[22] Filed: Jan. 11, 1990

[30] Foreign Application Priority Data

Jan. 26, 1989 [CH] Switzerland ............................ 245/89

[51] Int. Cl.⁵ ............................................. H01R 17/26
[52] U.S. Cl. ....................................... 174/9 R; 174/18
[58] Field of Search ............... 174/9 R, 18, 31 R, 151, 174/152 R; 118/50, 50.1; 439/1, 32

[56] References Cited

PUBLICATIONS

A cylinder is flanged onto the wall of a vacuum chamber in which a workpiece is to be coated and is to brought into contact with a current or power conductor for accomplishing same, and the current conductor in the form of a piston rod extends through this cylinder. The piston rod includes at one end a disk of graphite intended to contact the workpiece. An annular piston which is rigidly mounted on the piston rod is subjected at its outer side to the atmospheric pressure and closes a space off located within the cylinder and enclosed by a bellows, which space communicates with the vacuum chamber. A spiral pressure spring withing the cylinder which rests against its bottom and against the inner side of the piston couteracts the atmospheric pressure at the outer side of the piston. In case of a subatmospheric pressure in the space, the piston is moved inwards into the cylinder against the section of the spring and the contact between the current conductor and the workpiece is established automatically. If the vacuum chamber and the space is aerated, the spring urges the piston in the opposite direction such that the current contact is interrupted automatically, thus excluding faulty operator manipulations.

*Primary Examiner*—Laramie E. Askin
*Attorney, Agent, or Firm*—Notaro & Michalos

[57] ABSTRACT

A cylinder is flanged onto the wall of a vacuum chamber in which a workpiece is to be coated and is to brought into contact with a current or power conductor for accomplishing same, and the current conductor in the form of a piston rod extends through this cylinder. The piston rod includes at one end a disk of graphite intended to contact the workpiece. An annular piston which is rigidly mounted on the piston rod is subjected at its outer side to the atmospheric pressure and closes a space off located within the cylinder and enclosed by a bellows, which space communicates with the vacuum chamber. A spiral pressure spring within the cylinder which rests against its bottom and against the inner side of the piston counteracts the atmospheric pressure at the outer side of the piston. In case of a subatmospheric pressure in the space, the piston is moved inwards into the cylinder against the action of the spring and the contact between the current conductor and the workpiece is established automatically. If the vacuum chamber and the space is aerated, the spring urges the piston in the opposite direction such that the current contact is interrupted automatically, thus excluding faulty operator manipulations.

3 Claims, 1 Drawing Sheet

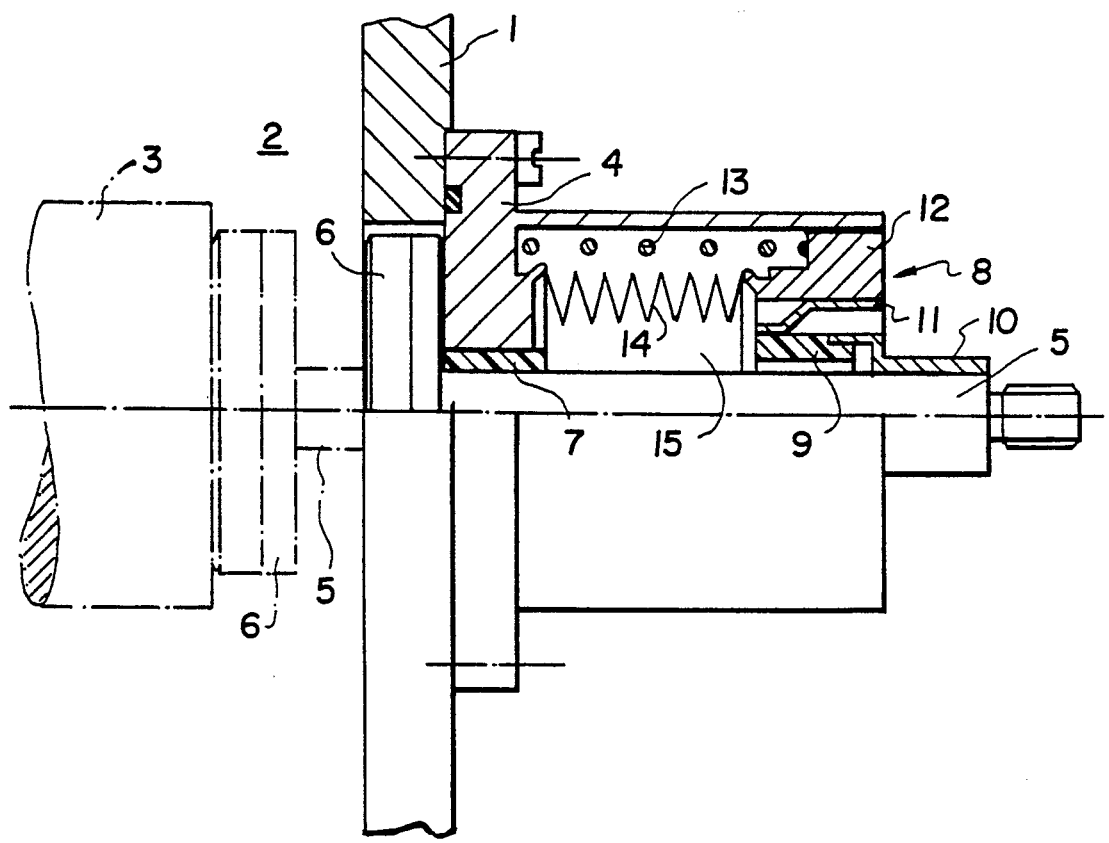

ELECTRICAL CURRENT LEAD-IN DEVICE AT A VACUUM CHAMBER

BACKGROUND OF THE INVENTION

1. Field of the Invention

The present invention relates to an electrical current lead-in device at a vacuum chamber operative to coat a workpiece which contacts a current conductor. In the process a coating material which has been vaporized in the vacuum chamber is deposited onto the workpiece or change located in the vacuum chamber.

SUMMARY OF THE INVENTION

It is a general object of the present invention to take measures which ensure that the workpiece is in an electrical contact with a current conductor only if a vacuum prevails in the chamber and that the contact is interrupted as soon as the vacuum chamber is pressurized or aerated, such as to avoid operating errors.

A further object is to provide an electrical current lead-in device in which the current conductor which extends into the vacuum chamber and which is designed as a piston rod supports an annular piston at a distance from the vacuum chamber and insulated against the piston rod, which annular piston is guided in a cyclinder flanged onto the wall of the chamber, which annular piston is subjected at its outer side to atmospheric pressure and limits by a part of its inner surface a sealed space communicating with the vacuum chamber and located within the cylinder and is subjected to a pressure force of a spring counteracting the atmospheric pressure, which spring features a spring force which at the vacuum prevailing in the sealed space is lower than the atmospheric pressure acting onto the outer side of the piston and by means of which the piston is displaced into a position in which the current conductor shaped as a piston rod contacts the workpiece in a current conducting state, which contact in the pressurized state of the vacuum chamber is interrupted due to an opposite displacement of the piston due to the higher pressure in this state prevailing in the sealed space and the spring force.

The advantage of the inventive current lead-in device is that the contact between the workpiece and the current conductor is immediately interrupted as soon as the vacuum chamber is aerated, i.e. pressurized, which interruption proceeds automatically by a spring force and that conversely the electrical contact is established again as soon as again a vacuum prevails in the vacuum chamber.

BRIEF DESCRIPTION OF THE DRAWING

This invention will be better understood and objects other than those set forth above will become apparent when consideration is given to the following detailed description thereof. Such dsecription makes reference to the annexed drawing in which The single FIGURE is a longitudinal sectional view of a preferred embodiment of the invention.

DESCRIPTION OF THE PREFERRED EMBODIMENT

The wall 1 of the vacuum chamber, illustrated in the FIGURE broken off, encloses the vacuum chamber 2 in which the workpiece 3 to be coated is located, as illustrated by the dash-dotted lines. A cylinder 4 which is open at one end is flanged in a vacuum-tight state onto the wall 1 of the vacuum chamber. A piston rod 5 extends through the cylinder 4 coaxially to the cylinder axis which piston rod 5 forms the current conductor which is connected at its right hand end to a source of electrical power not particularly illustrated in the FIGURE. The piston rod 5 supports at its left end a disk 6 consisting of graphite which in order to establish the electrical contact comes to abut the workpiece 3 by its face surface when the current or power conductor in form of the piston rod 5 is axially displaced towards the workpiece 3, which state is illustrated in the FIGURE by dash-dotted lines. To this end the piston rod 5 which forms the current conductor is guided at the bottom of the cylinder 4 by a bushing 7 consisting of an insulating material.

An annular piston 8 acts as second guide which piston 8 is mounted to the piston rod 5 and guided in the cylinder 4. This piston 8 is assembled of individual parts whereby a bushing 9 consisting of an insulating material is connected via a metallic bush-shaped body 10 to the piston rod 5, and a further bush-shaped metallic part 11 which encloses the part 9 consisting of an insulating material is rigidly mounted to a radially outer part 12 guided in said cylinder 4. The end of a spiral pressure spring 13 rests at the inside against this part 12 of the piston 8 of which the other ends rests against the bottom of the cylinder 4. A bellows 14 is located radially inwards of this spring 13 and is mounted by the one end to the bottom of the cylinder 4 and by the other end to the annular piston 8. This bellow 14 encloses a space 15 in a vacuum tight manner which space 15 is in communication with the vacuum chamber 2 for receipt of a workpiece 3. Because the piston rod 5 is axially movable relative to the bottom of the cylinder 4 and no seal is present thereat, the vacuum chamber 2 is in communication with said space 15 at this location, which means that the same pressure prevails in both spaces.

The atmospheric pressure acts against the outer surface of the annular piston 8 and the force of the spiral pressure spring 13 acts against the inner surface of the piston, but the pressure force thereof is overcome by the atmospheric pressure acting against the outer side of the piston if the subatmospheric pressure present in the vacuum chamber 2 also prevails in the space 15 inside the bellows 14. As soon as this subatmospheric pressure is produced, an automatic axial displacing of the piston rod 5 occurs such that the disk 6 consisting of graphite reaches the dash-dotted position and the electrical contact to the workpiece 3 is established. The supply of the current is thus operated by the vacuum. If, in contrast thereto, the vacuum chamber 2 is aerated, the higher pressure prevails also in the space 15 inside of the bellows 14 and the spring 13 urges in such case the annular piston 8 towards the right-hand side such that the current or power supply is interrupted. This avoids faulty operator manipulations and, accordingly, the danger of an accident due to the electric current is done away with.

While there is shown and described a present preferred embodiment of the invention, it is to be distinctly understood that the invention is not limited thereto, but may be otherwise variously embodied and practiced within the scope of the following claims.

I claim:

1. An electrical current lead-in device at a vacuum chamber operative to coat a workpiece which contacts a current conductor, in which a current conductor extends into the vacuum chamber and is designed as a piston rod that supports an annular piston at a distance from said vacuum chamber and insulated against the piston rod, which annular piston is guided in a cylinder flanged onto the wall of said vacuum chamber, which annular piston is subjected at its outer side to atmospheric pressure and limits by a part of its inner surface a sealed space communicating with said vacuum chamber and located within said cylinder and is subjected to a pressure force of a spring counteracting the atmospheric pressure, which spring features a spring force which at the vacuum prevailing in said sealed space is lower than the atmospheric pressure acting onto the outer side of the piston and by means of which the piston is displaced into a position in which the current conductor designed as a piston rod contacts said workpiece in a current conducting state, which contact in the pressurized state of said vacuum chamber is interrupted due to an opposite displacement of said piston due to the in this state higher pressure prevailing in said sealed space and said spring force.

2. The electrical current lead-in device of claim 1 in which said space communicating with said vacuum chamber is sealed by a bellows located inside of said cylinder and encasing said piston rod at a distance therefrom which bellows has one end mounted to the cylinder bottom and the opposite end mounted to said annular piston.

3. The electrical current lead-in device of claim 2 in which said spring is a spiral pressure spring located inside of said cylinder between its wall and said bellows.

* * * * *